United States Patent
Chen et al.

(10) Patent No.: US 11,096,312 B1
(45) Date of Patent: Aug. 17, 2021

(54) HEAT DISSIPATION APPARATUS WITH FAN

(71) Applicant: AIC INC., Taoyuan (TW)

(72) Inventors: Yen-Chih Chen, Taoyuan (TW);
Chi-Yuan Hsiao, Taoyuan (TW);
Hsih-Ting You, Taoyuan (TW);
Yu-Hsiang Lin, Taoyuan (TW)

(73) Assignee: AIC INC., Taoyuan (CN)

( * ) Notice: Subject to any disclaimer, the term of this patent is extended or adjusted under 35 U.S.C. 154(b) by 0 days.

(21) Appl. No.: 16/892,804

(22) Filed: Jun. 4, 2020

(51) Int. Cl.
*H05K 7/20* (2006.01)

(52) U.S. Cl.
CPC ..... *H05K 7/20172* (2013.01); *H05K 7/20145* (2013.01); *H05K 7/20163* (2013.01); *H05K 7/20409* (2013.01); *H05K 7/20509* (2013.01)

(58) Field of Classification Search
CPC ........... H05K 7/20145; H05K 7/20163; H05K 7/20172; G06F 1/20; G06F 1/203; H01L 23/467
USPC ................................................ 361/691–697
See application file for complete search history.

(56) References Cited

U.S. PATENT DOCUMENTS

| | | | | |
|---|---|---|---|---|
| 5,630,469 A * | 5/1997 | Butterbaugh | ....... | H01L 23/4006 165/122 |
| 6,711,013 B2 * | 3/2004 | Wobig | ....... | G06F 1/20 257/E23.099 |
| 7,085,135 B2 * | 8/2006 | Chu | ....... | F28F 3/02 165/185 |
| 7,359,192 B2 * | 4/2008 | Yang | ....... | H01L 23/4093 165/80.3 |
| 10,101,097 B2 * | 10/2018 | Remsburg | ....... | F28F 1/124 |
| 10,299,403 B2 * | 5/2019 | Janak | ....... | G06F 1/20 |
| 2007/0058341 A1 * | 3/2007 | Hsiao | ....... | H01L 23/467 361/695 |
| 2007/0091566 A1 * | 4/2007 | Sun | ....... | H05K 7/20172 361/695 |
| 2017/0083058 A1 * | 3/2017 | Janak | ....... | G06F 1/20 |

* cited by examiner

*Primary Examiner* — Zachary Pape
(74) *Attorney, Agent, or Firm* — Chun-Ming Shih; HDLS IPR Services

(57) ABSTRACT

A heat dissipation apparatus includes a heat sink unit, a flow guiding structure and a fan. In addition, the heat sink unit includes a base and a fin set arranged on the base. The flow guiding structure includes an air shield and an engagement frame arranged at one end of the air shield. The air shield includes an enclosure space formed at an internal thereof. The enclosure space includes an opening formed at two ends of the air shield respectively, and the air shield covers an exterior of the fin set with the enclosure space. The engagement frame is selectively arranged at an exterior of any one of the openings of the air shield; and a fan is arranged on the engagement frame.

8 Claims, 6 Drawing Sheets

HEAT DISSIPATION APPARATUS WITH FAN

BACKGROUND OF THE INVENTION

Field of the Invention

The technical field relates to a heat sink, and in particular, to a heat dissipation apparatus equipped with a fan.

Description of Related Art

As the computing power of electronic components, such as CPU, continues to advance and becomes more powerful, the amount of heat generated during the operation of such components become higher; consequently, the need for heat dissipation also increases. Accordingly, the question on how to increase the cooling effect is one of the important topics for the improvement of heat sinks.

Most of the currently existing heat sinks mainly utilize a set of cooling fins together with a fan to achieve the cooling. However, such known heat sinks cannot effectively concentrate the airflow or cool air provided by the fan, and their configurations cannot be adjusted according to the needs of different situation. As a result, there are numerous limitations to the use of such known devices.

In view of above, the inventor seeks to improve and overcome the aforementioned drawback associated with the currently existing technology after years of research and development along with the utilization of academic theories in order to achieve a reasonable design of the present invention capable of effectively overcoming the aforementioned drawbacks.

SUMMARY OF THE INVENTION

A primary objective of the present invention is to provide a heat dissipation apparatus, capable of using an additional air shield to concentrate the air flow or cool air provided by the fan on the heat dissipation assembly, and allowing adjustment of the configuration position of the fan depending upon the needs.

To achieve the aforementioned objective, the present invention provides a heat dissipation apparatus, comprising a heat sink unit, a flow guiding structure and a fan. In addition, the heat sink unit comprises a base and a fin set arranged on the base. The flow guiding structure comprises an air shield and an engagement frame arranged at one end of the air shield. The air shield includes an enclosure space formed at an internal thereof. The enclosure space includes an opening formed at two ends of the air shield respectively, and the air shield covers an exterior of the fin set with the enclosure space. The engagement frame is selectively arranged at an exterior of any one of the openings of the air shield; and a fan is arranged on the engagement frame.

DETAILED DESCRIPTION OF THE INVENTION

The following provides a detailed technical content of the present invention along with the accompanied drawings. However, it shall be understood that the accompanied drawings are provided for reference and illustration purposes only such that they shall not be used to limit the scope of the present invention.

Figure 1:
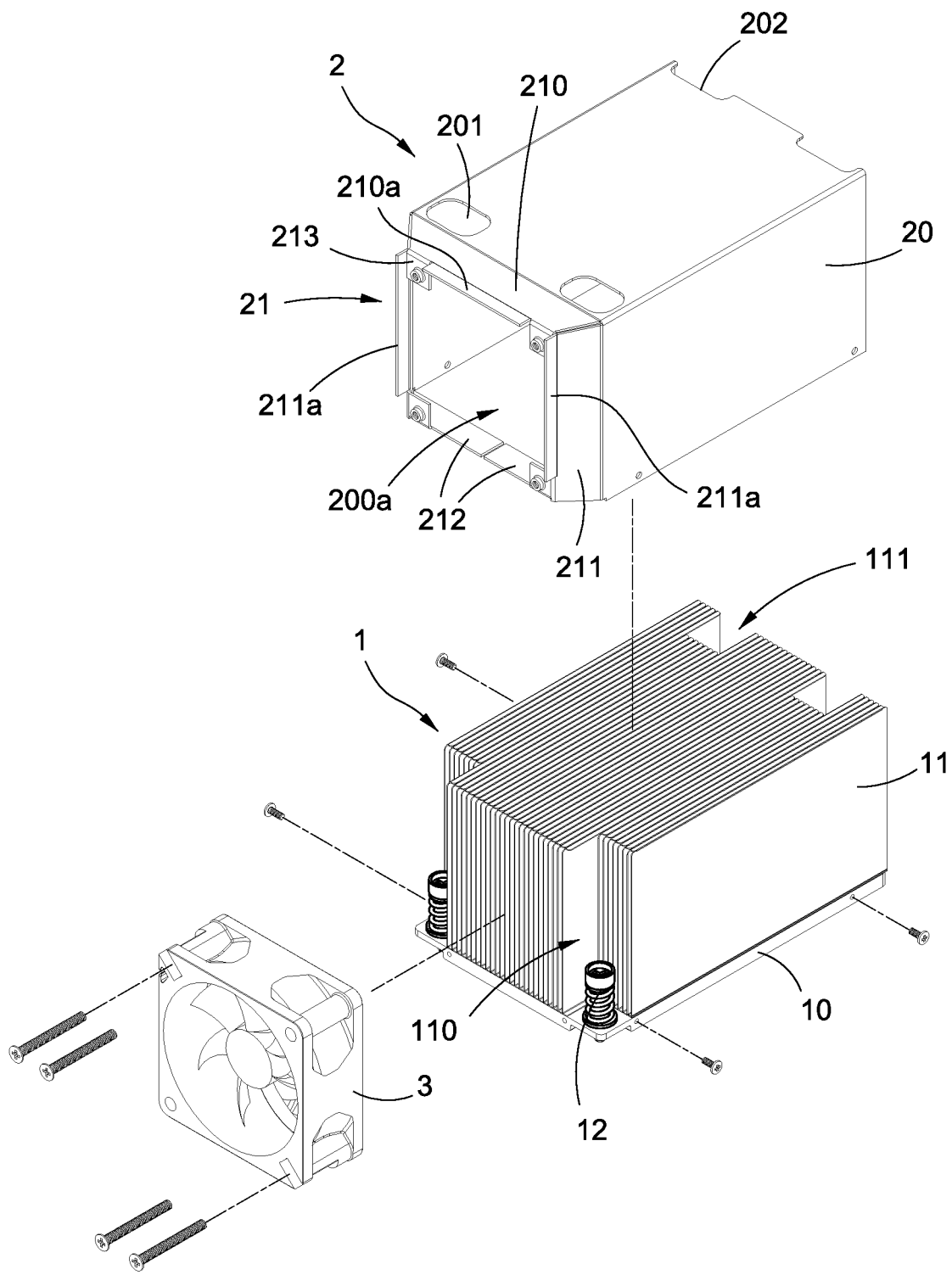
FIG. 1 is a perspective exploded view of the present invention.
Figure 2:
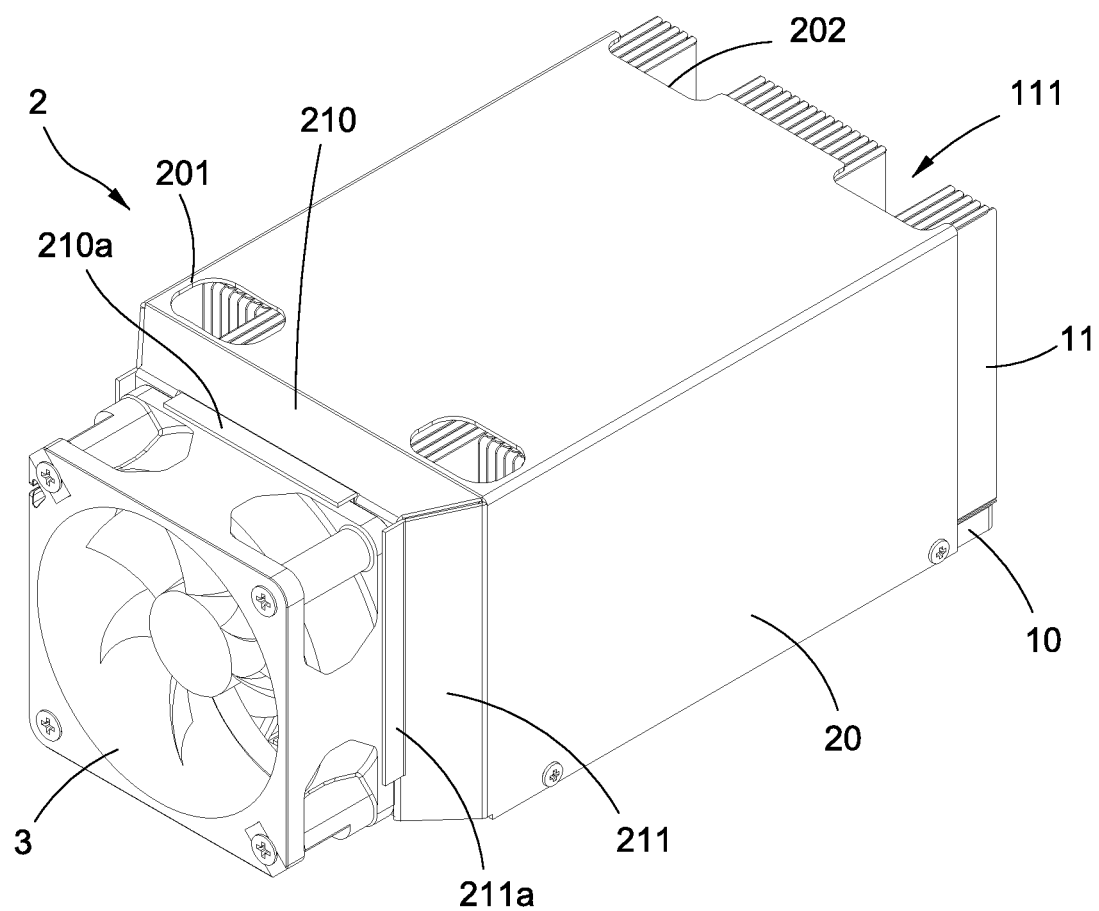
FIG. 2 is a perspective assembly view of the present invention.

Please refer to FIG. 1 to FIG. 2, showing a perspective exploded view and a perspective assembly view of the present invention. The present invention provides a heat dissipation apparatus, comprising a heat sink unit 1, a flow guiding structure 2 and a fan 3.

Figure 3:
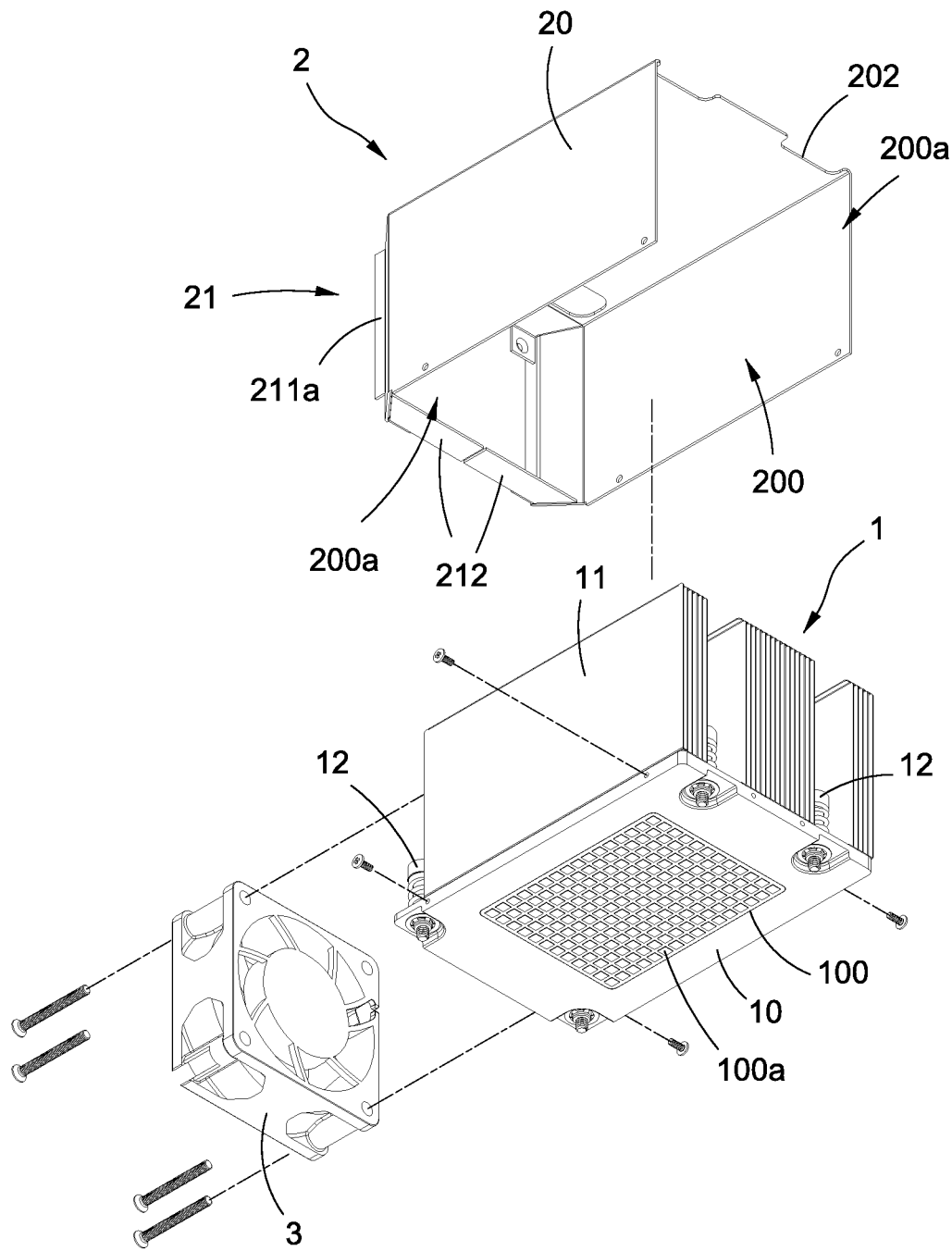
FIG. 3 is a perspective exploded view of the present invention viewed from another angle.
Figure 4:
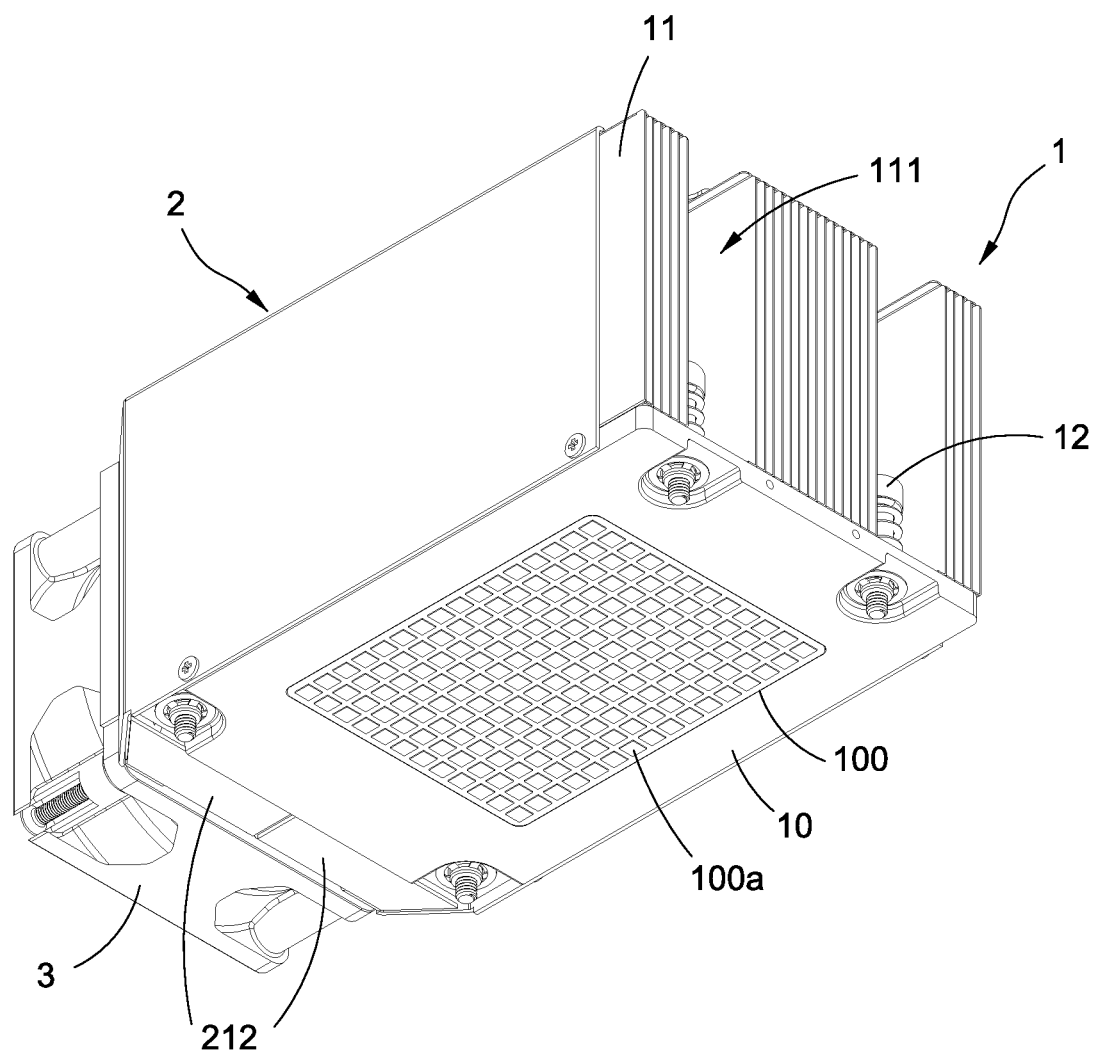
FIG. 4 is a perspective assembly view of the present invention viewed from another angle.

The heat sink unit 1 comprises a base 10 and a fin set 11 arranged on the base 10. The fin set 11 is formed by a plurality of fins arranged spaced apart from each other, in order to allow the external air to flow inside the fin set 11. As shown in FIG. 3 and FIG. 4, a bottom surface of the base 10 can include a thermal conductive plate 100 embedded therein. The surface on which the thermal conductive plate 100 is exposed can be used to contact with an electronic heat generating element (not shown in the drawings), such as CPU etc. In addition, the surface on which the thermal conductive plate 100 is exposed includes a plurality of contact portions 100a protruded therefrom, and each of the contact portions 100a can be arranged in a matrix for disposing on the surface on which the thermal conductive plate 100 is exposed, thereby increasing the filling space for a thermal conductive medium (not shown in the drawings), such as thermal paste etc., in order to prevent generation of contact voids.

The flow guiding structure 2 comprises an air shield 20 and an engagement frame 21 arranged at one end of the air shield 20. The air shield 20 can be made of a sheet of a metal material and manufactured via the pressing or bending method in order to form an enclosure space 200 at an internal thereof. The enclosure space 200 includes an opening 200a formed at two ends of the air shield 20 respectively such that the air shield 20 is able to cover an exterior of the aforementioned fin set 11 with the enclosure space 200, i.e. the fin set 11 is located inside the enclosure space 200. In addition, the air shield 20 can utilize the fastening elements of screws etc. for fastening onto the base 10 for attachment therewith.

Accordingly, the engagement frame 21 is selectively arranged at an exterior of any one of the openings 200a of the aforementioned air shield 20. In addition, it is formed by a top surface 210, and two side surfaces 211 respectively located at two sides of the top surface 210 and formed to taper inward, and short surfaces 212 extended inward respectively from the two side surfaces 211 and arranged opposite from each other. Furthermore, the four inner corners of the engagement frame 21 include a protruding piece 213 formed thereon respectively in order to allow the aforementioned fan 3 to be fastened and secured thereon. Moreover, to facilitate the assembly and positioning of the fan 3, an inner edge of the top surface 210 can further include a upper retaining plate 210a protruded thereon, and inner edges of the two side surfaces 211 include a lateral retaining plate 211a protruded thereon respectively in order to allow the fan 3 to be positioned and arranged in a space formed by the upper retaining plate 210a and the two lateral retaining plates 211a.

In addition, an outer perimeter of the base 10 can include a plurality of fixation elements 12, and the fin set 11 can also be arranged to cooperate with the plurality of fixation elements 12 in order to reserve cut-out spaces 110, 111. Furthermore, a top surface of the aforementioned air shield 20 also cooperates with each one of the cut-out spaces 110, 111 to form opening holes 201 or notches 202. In an exemplary embodiment of the present invention, the cut-out space 110 at an opening 200a of the air shield 20 corresponds to the aforementioned opening hole 201; the cut-out space 111 at another opening 200a of the air shield 20 corresponds to the aforementioned notch 202. Such design can also be adopted depending upon the needs. For example, when the fin set 11 is not exposed out of the air shield 20, the arrangement of the aforementioned opening hole 201 can be adopted. When the fin set is partially exposed out of the air shield 20, then the aforementioned arrangement of the notch 202 can be adopted.

Accordingly, with the aforementioned structure and assembly, a heat dissipation apparatus of the present invention can be obtained.

Figure 5:
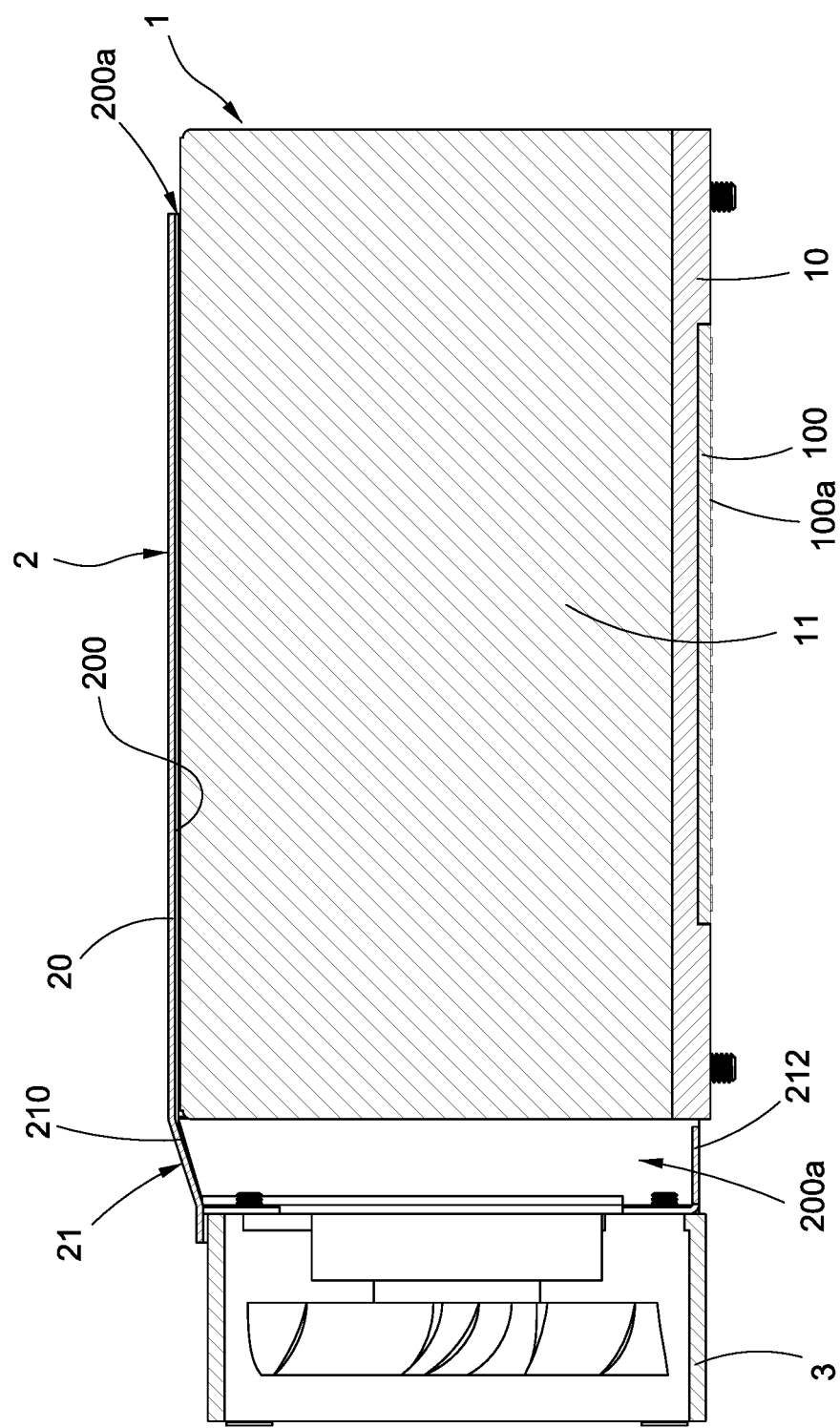
FIG. 5 is a side cross-sectional view of the present invention.
Figure 6:
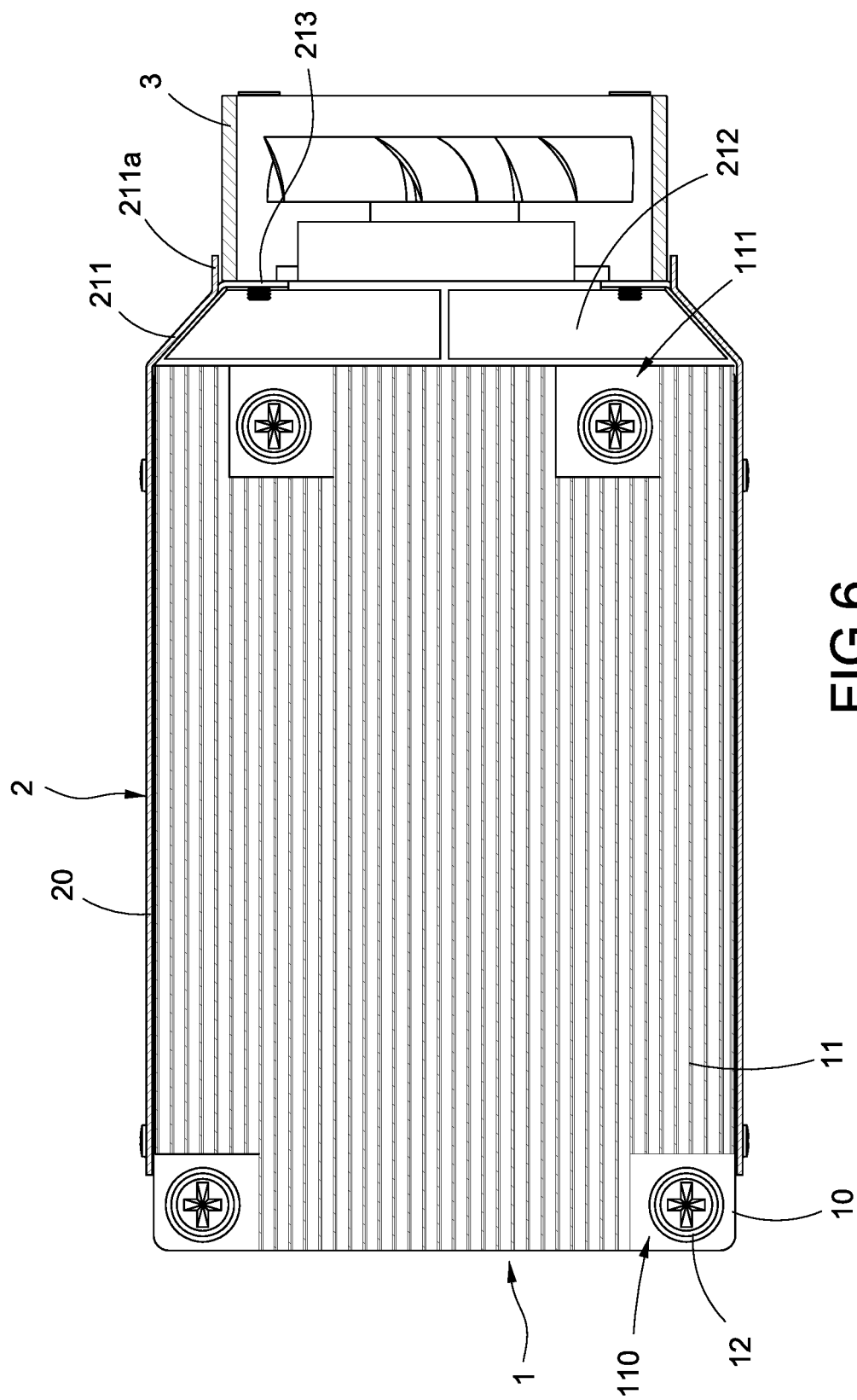
FIG. 6 is a top cross-sectional view of another exemplary embodiment of the present invention.

Furthermore, as shown in FIG. 5, the present invention adopts the design of attaching the aforementioned fan 3 onto the engagement frame 21 via the flow guiding structure 2, thereby allowing the air flow or cool air provided by the fan 3 to be concentrated inside the air shield 30 more effectively. Consequently, the fin set 11 located inside the air shield 20 is able to obtain excellent cooling and heat dissipation effect. In an exemplary embodiment, the fan 3 is configured to be arranged at an opening 200a of the air shield 20. In addition, as shown in FIG. 6, the fan 3 can also be configured to be arranged at another opening 200a of the air shield 20. Through the change of the configuration location and direction of the air shield 20 and the heat sink unit 1, the position of the fan can be adjusted depending upon the needs, thereby reducing the use limitation and increasing the flexibility of use.

In view of the above, the present invention is able to achieve the expected objectives of use and to overcome the drawbacks of the prior arts. Therefore, the present invention is of novelty and inventive step, complying with the patentability for an invention patent. Accordingly, patent application is hereby filed according to the law in light of the grant of the patent right for the protection of the rights of the inventor.

Nevertheless, it shall be understood that the purpose of the above descriptive content is provided to illustrate the preferred exemplary embodiments of the present invention only rather than to limit the scope of the claims of the present invention; therefore, any equivalent structural modifications made based on the content of the specification and drawings of the present invention shall be within the scope of the present invention.

What is claimed is:

1. A heat dissipation apparatus, comprising:
   a heat sink unit comprising a base and a fin set arranged on the base;
   a flow guiding structure comprising an air shield and an engagement frame arranged at one end of the air shield; the air shield having an enclosure space formed at an internal thereof; the enclosure space having an opening formed at two ends of the air shield respectively, and the air shield covering an exterior of the fin set with the enclosure space; the engagement frame selectively arranged at an exterior of any one of the openings of the air shield; and
   a fan arranged on the engagement frame,
   wherein the engagement frame is formed by a top surface, and two side surfaces respectively located at two sides of the top surface and formed to taper inward, and short surfaces extended inward respectively from the two side surfaces and arranged opposite from each other,
   wherein four inner corners of the engagement frame include a protruding piece formed thereon respectively, and the fan is fastened onto the protruding pieces.

2. The heat dissipation apparatus according to claim 1, wherein a bottom surface of the base includes a thermal conductive plate embedded therein.

3. The heat dissipation apparatus according to claim 2, wherein a surface on which the thermal conductive plate is exposed includes a plurality of contact portions protruded therefrom.

4. The heat dissipation apparatus according to claim 3, wherein the plurality of contact portions are arranged in a matrix for disposing on the surface on which the thermal conductive plate is exposed.

5. The heat dissipation apparatus according to claim 1, wherein an outer perimeter of the base includes a plurality of fixation elements, and the fin set is arranged to cooperate with the plurality of fixation elements in order to reserve cut-out spaces.

6. The heat dissipation apparatus according to claim 5, wherein a top surface of the air shield cooperates with the cut-out spaces to form opening holes or notches.

7. The heat dissipation apparatus according to claim 1, wherein the fin set is formed by a plurality of fins arranged spaced apart from each other.

8. The heat dissipation apparatus according to claim 1, wherein an inner edge of the top surface includes an upper retaining plate protruded thereon, and inner edges of the two side surfaces include a lateral retaining plate protruded thereon respectively, and the fan is positioned and arranged in a space formed by the upper retaining plate and the two lateral retaining plates.

* * * * *